United States Patent
Wu et al.

(10) Patent No.: US 8,779,824 B2
(45) Date of Patent: Jul. 15, 2014

(54) CLOCK DISTRIBUTION USING MTJ SENSING

(71) Applicant: QUALCOMM Incorporated, San Diego, CA (US)

(72) Inventors: Wenqing Wu, San Diego, CA (US); Kendrick H. Yuen, San Diego, CA (US); David W. Hansquine, Raleigh, NC (US); Robert P. Gilmore, Poway, CA (US); Jeff A. Levin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/716,263

(22) Filed: Dec. 17, 2012

(65) Prior Publication Data

US 2014/0167831 A1 Jun. 19, 2014

(51) Int. Cl.
*G06F 1/04* (2006.01)
*H03K 3/00* (2006.01)

(52) U.S. Cl.
USPC ............ 327/291; 327/298; 327/299; 327/511

(58) Field of Classification Search
USPC .................................. 327/291, 298, 299, 511
See application file for complete search history.

(56) References Cited

U.S. PATENT DOCUMENTS

| | | | | |
|---|---|---|---|---|
| 6,205,073 | B1* | 3/2001 | Naji | 365/209 |
| 7,859,255 | B2 | 12/2010 | Doogue et al. | |
| 2004/0202022 | A1* | 10/2004 | Sharma et al. | 365/185.08 |
| 2007/0063690 | A1* | 3/2007 | De Wilde et al. | 324/117 R |
| 2010/0220512 | A1 | 9/2010 | Chen et al. | |
| 2011/0199132 | A1* | 8/2011 | Motz et al. | 327/124 |
| 2011/0291761 | A1 | 12/2011 | Rao | |
| 2012/0025817 | A1* | 2/2012 | Romero et al. | 324/251 |
| 2012/0063195 | A1 | 3/2012 | Lam et al. | |
| 2012/0218667 | A1* | 8/2012 | Nagasawa et al. | 360/324.11 |

* cited by examiner

*Primary Examiner* — John Poos
(74) *Attorney, Agent, or Firm* — Sam Talpalatsky; Nicholas J. Pauley; Joseph Agusta

(57) ABSTRACT

Clock signals are distributed on a chip by applying an oscillating magnetic field to the chip. Local clock generation circuits including magnetic field sensors are distributed around the chip and are coupled to local clocked circuitry on the chip. The magnetic field sensors may include clock magnetic tunnel junctions (MTJs) in which a magnetic orientation of the free layer is free to rotate in the free layer plane in response to the applied magnetic field. The MTJ resistance alternates between a high resistance value and a low resistance value as the free layer magnetization rotates. Clock generation circuitry coupled to the clock MTJs senses voltage oscillations caused by the alternating resistance of the clock MTJs. The clock generation circuitry includes amplifiers, which convert the sensed voltage into local clock signals.

23 Claims, 14 Drawing Sheets

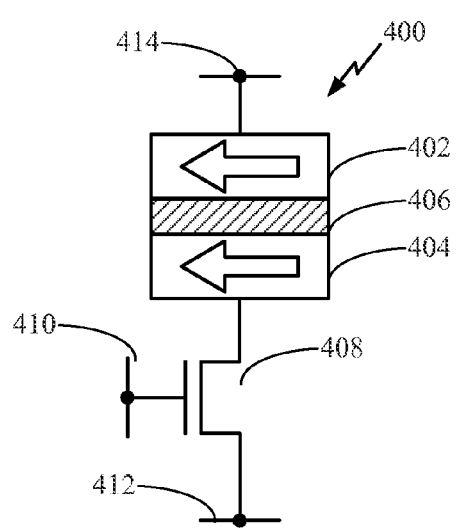
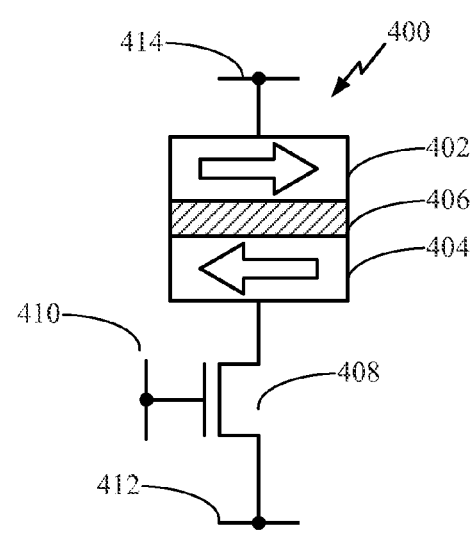
FIG. 4A
PRIOR ART
FIG. 4B
PRIOR ART

CLOCK DISTRIBUTION USING MTJ SENSING

TECHNICAL FIELD

The present disclosure generally relates to magnetic tunnel junction (MTJ) devices. More specifically, the present disclosure relates to MTJ sensing of distributed clock signals.

BACKGROUND

A significant amount of power is consumed by clock distribution networks that provide clock signals to numerous clocked circuits of systems on chip (SOC). Clock distribution networks can consume 25% to 30% of total chip power in current high speed CPUs, for example.

To reduce clock skew, clock distribution networks are generally configured in a tree or mesh structure. Referring to FIG. 1A, clock distribution networks can be configured in a tree structures, commonly referred to as an H-tree structure 100 coupled to a clock source 110. The H-tree structure 100 includes a number of uniformly distributed branches 102. Referring to FIG. 1B, branches 102 of an H-tree structure 100 are coupled to respective gated buffers shown as clock gaters 114. The clock gaters 114 couple to clocked circuitry shown as clock loads 106. Pre-gater clock distribution circuitry 108 includes branches 102 of the H-tree structure 100, which are coupled to a clock source 110. Post gater clock distribution circuitry 112 includes the clock loads 106 and may include clock buffers 114 coupled between the gated buffers 104 and the clock loads 106. The H-tree structure 100 reduces clock skew by branching uniformly so that clock signal delay is uniform on each branch. However, the uniformity of branches in an H-tree structure 100 cannot be maintained across increasingly complex devices, which may include millions of clocked circuits, such as logic gates, for example.

Referring to FIG. 2A, a mesh network 200, is another clock distribution topography that has been used in complex devices as a practical way to distribute a clock signal from a clock source 210. Referring to FIG. 2B, a mesh network topography includes a clock mesh 200 configured over an area of a chip. Pre-mesh clock distribution circuitry 208 coupled to a clock source 210 distributes a clock signal to a number of mesh drivers 220. The pre-mesh clock distribution circuitry 208 may include branches 102 configured in an H-tree structure as shown in FIG. 1A, for example. The mesh drivers 220 apply the clock signal to respective portions of the clock mesh, for example. Post gater clock distribution circuitry 212 includes the clock loads 206 and may include clock buffers 214 coupled between gated buffers 204 and clock loads 206.

The mesh network 200 also reduces skew of the distributed clock signal and is more suitable than a pure H-tree structure 100 for clock distribution in highly integrated devices. However, the use of mesh networks 200 for clock distribution increases routing overhead and substantially increases capacitance. The increased capacitance of a mesh network 200 hinders efforts to improve clock speeds and can be a limiting factor in the development of devices with high-GHz clock speeds. System-on-chip (SOC) clock speed are currently limited to a few GHz, for example.

Power consumption and clock skew are significant factors that limit the scaling of integrated circuits. It is desirable to reduce power consumption and reduce or eliminate clock skew introduced by clock distribution networks to thereby allow high GHz clock frequencies in SOC applications, for example.

BRIEF SUMMARY

According to aspects of the present disclosure, an apparatus for distributing a clock signal includes a first clocked circuit on a chip, and clock generation circuitry on the chip coupled to the first clocked circuit. The clock generation circuitry includes a first magnetic field sensing device configured to sense an oscillating magnetic field and amplifier circuitry coupled between the first magnetic field sensing device and the first clocked circuit. The clock generation circuitry is configured to output the clock signal in response to the oscillating magnetic field.

Another aspect of the present disclosure describes a method for distributing clock signals. The method includes applying an oscillating magnetic field to a number of distributed magnetic tunnel junctions (MTJs). The method also includes sensing the oscillating magnetic field by the MTJs, and converting the sensed magnetic field oscillations into a clock signal by circuitry coupled to the MTJs.

An apparatus for distributing clock signals on a chip, according to another aspect of the present disclosure, includes means for applying an oscillating magnetic field to a number of distributed magnetic tunnel junctions (MTJs). The apparatus also includes means for sensing the oscillating magnetic field by the MTJs, and means for converting the sensed magnetic field oscillations into a clock signal by circuitry coupled to the MTJs.

Another aspect of the present disclosure describes a computer program product for distributing clock signals. The computer program product includes a computer-readable medium having program code recorded thereon. According to this aspect of the disclosure, the program code includes program code to apply oscillating magnetic fields to distributed magnetic tunnel junctions (MTJs), program code to sense the oscillating magnetic fields by the MTJs and program code to convert the sensed magnetic field oscillations into clock signals by circuitry coupled to the MTJs.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 4A and 4B are schematic circuit diagrams illustrating magnetic tunnel junction structures according to the prior art.

DETAILED DESCRIPTION

According to aspects of the present disclosure, clock signals are distributed to clocked circuits, such as logic gates on a chip, by applying an oscillating magnetic field to at least portions of the chip. Clock generation circuitry is coupled to one or more of the clocked circuits. The clock generation circuitry may be located proximately with clocked circuits on the chip to reduce clock skew. In one aspect, the clock generation circuitry includes one or more magnetic field sensing devices, such as magnetic tunnel junctions (MTJs). The clock generation circuitry is configured to generate a local clock signal in response to the oscillating magnetic field. This eliminates the need for a conventional clock distribution network and thereby reduces skew and power consumption related to the conventional clock distribution network.

Figure 1A:
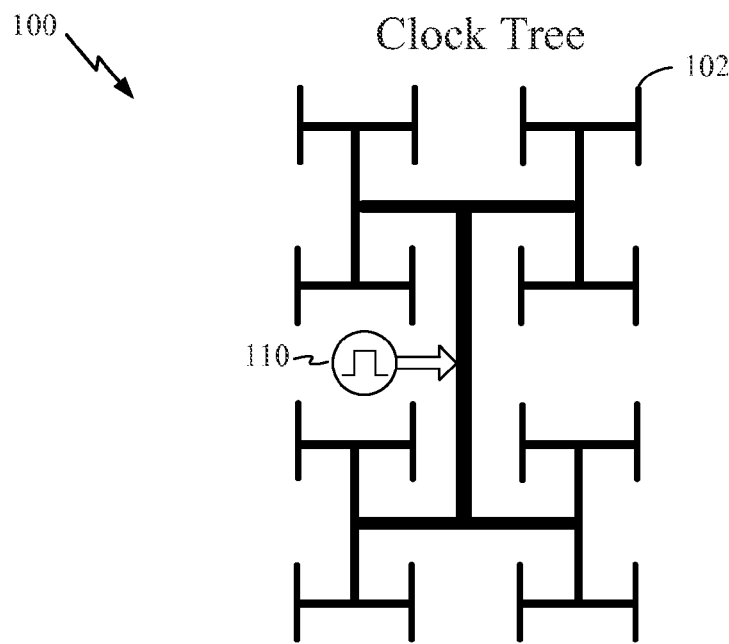
FIGS. 1A and 1B are diagrams illustrating h-tree clock distribution networks according to the prior art.
Figure 1B:
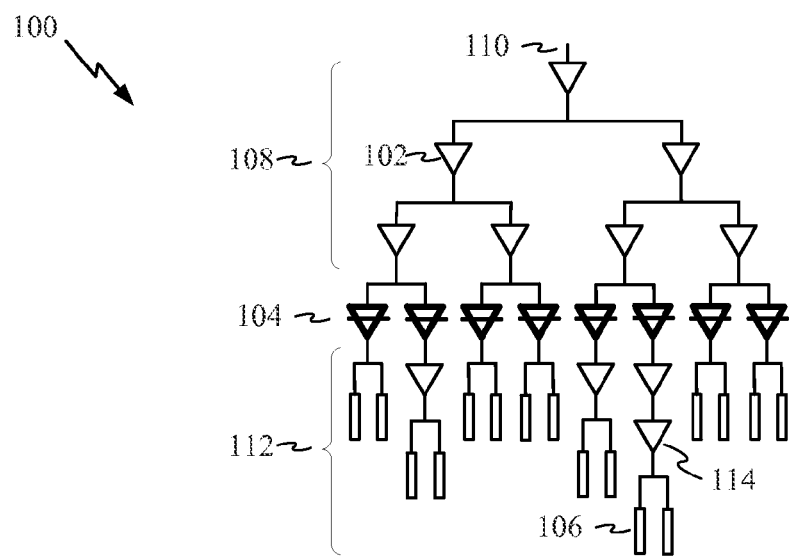
Figure 2A:
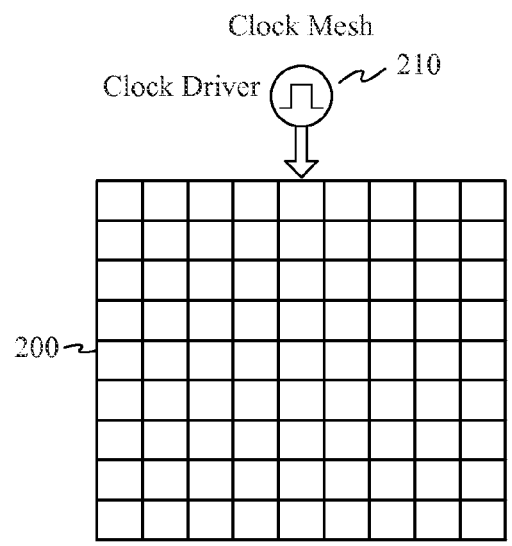
FIGS. 2A and 2B are diagrams illustrating a clock mesh network according to the prior art.
Figure 2B:
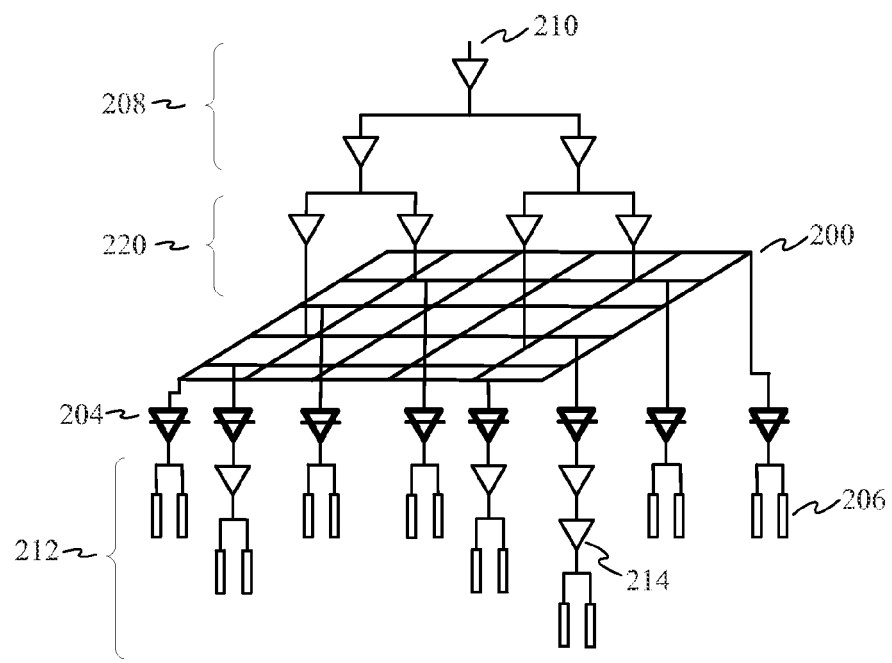
Figure 3:
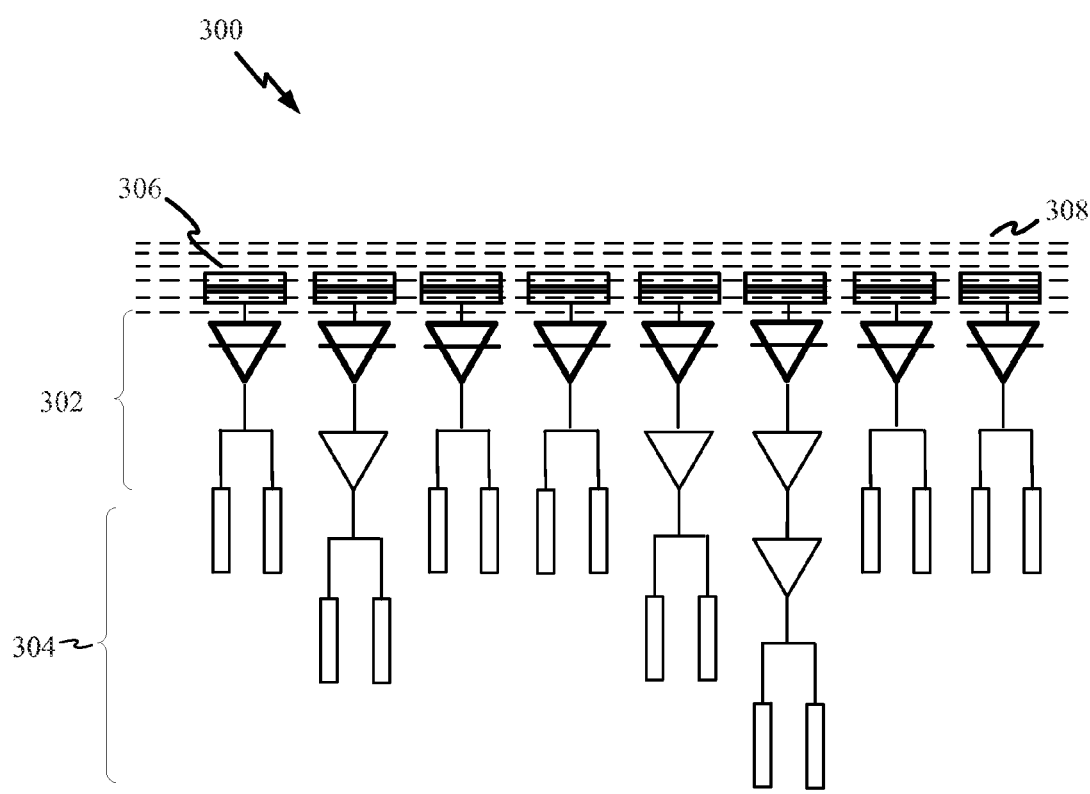
FIG. 3 is a schematic circuit diagram illustrating a clock distribution network according to aspects of the present disclosure.

Referring to FIG. 3, a clock distribution apparatus 300 according to aspects of the present disclosure includes a number of clock generation circuits 302 distributed on a chip. Each of the clock generation circuits 302 is coupled to corresponding clocked circuitry 304 that is topographically proximate to the respective clock generation circuitry 302. Each of the clock generation circuits 302 includes a clock MTJ 306 that is configured for sensing an oscillating magnetic field 308. The clock MTJs 306 serve as local clock sources. The number and location of the clock MTJs 306 can be configured to reduce clock skew and power consumption, for example.

Clock Magnetic Tunnel Junctions

MTJs can be used as memory elements in magnetic random access memory MRAM, for example. Unlike conventional random access memory (RAM) chip technologies, in MRAM data is not stored as electric charge, but is instead stored by magnetic polarization of storage elements. The storage elements are formed from two ferromagnetic layers separated by a tunneling layer. One of the two ferromagnetic layers, which is referred to as the fixed layer or pinned layer, has a magnetization that is fixed in a particular direction. The other ferromagnetic magnetic layer, which is referred to as the free layer, has a magnetization direction that can be altered to represent either a "1" when the free layer magnetization is anti-parallel to the fixed layer magnetization or "0" when the free layer magnetization is parallel to the fixed layer magnetization or vice versa. An MTJ normally also includes top and bottom electrodes and may be formed with or without an antiferromagnetic layer to pin the fixed layer. The electrical resistance of an MTJ depends on whether the free layer magnetization and fixed layer magnetization are parallel or anti-parallel with each other. A memory device such as Spin-Transfer Torque (STT) MRAM is built from an array of individually addressable MTJs.

To write data in STT MRAM, a write current with a specific direction of write "1" or "0", which exceeds a critical switching current, is applied through an MTJ. The write current exceeding the critical switching current is sufficient to change the magnetization direction of the free layer. When the write current flows in a first direction, the MTJ can be placed into or remain in a first state, in which its free layer magnetization direction and fixed layer magnetization direction are aligned in a parallel orientation. When the write current flows in a second direction, opposite to the first direction, the MTJ can be placed into or remain in a second state, in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In STT MRAM, two distinct states are defined by two different resistances of an MTJ in a bitcell of the MRAM. The two different resistances represent a logic "0" and a logic "1" value stored by the MTJ.

An example of a magnetic tunnel junction (MTJ) structure is described with reference to a bitcell of an MRAM in FIGS. 4A and 4B. FIG. 4A shows a magnetic tunnel junction 400 in a first state and FIG. 4B shows the magnetic tunnel junction 400 in a second state. The magnetic tunnel junction 400 includes two magnetic layers, the free layer 402 and the pinned layer 404, and an insulating layer 406, e.g., a MgO barrier between the free layer 402 and the pinned layer 404. In an MRAM bit cell, the MTJ 400 is coupled between a bit line 414 and a selecting transistor 408. The selecting transistor is coupled to a source line (SL) 412 and controlled by a word line (WL) 410.

The electrical resistance of the MTJ ($R_{MTJ}$) depends on the state of the MTJ 400. The MTJ 400 has low resistance when the magnetic orientations of the free layer 402 and pinned layer 404 are in the same direction (parallel) as shown in FIG. 4A. The MTJ has high resistance when the magnetic orientations of the free layer 402 and the pinned layer 404 are in different direction (anti-parallel) as shown in FIG. 4B.

In an MRAM, the state of the MTJ 400 depends on the direction of a write current applied through the MTJ during a write operation. If a write current flows from free layer 402 to pinned layer 404, a parallel state (state0) is written to the MTJ 400. If write current flows from pinned layer 404 to free layer 402, an anti-parallel state (state1) is written to the MTJ 400.

In addition to MRAM applications, magnetic tunnel junctions (MTJs) are also used to sense miniscule magnetic fields in applications such as magnetic disk read heads, for example. In high density drive read heads, MTJs are used to sense small variations in magnetic field strength and direction.

Figure 5:
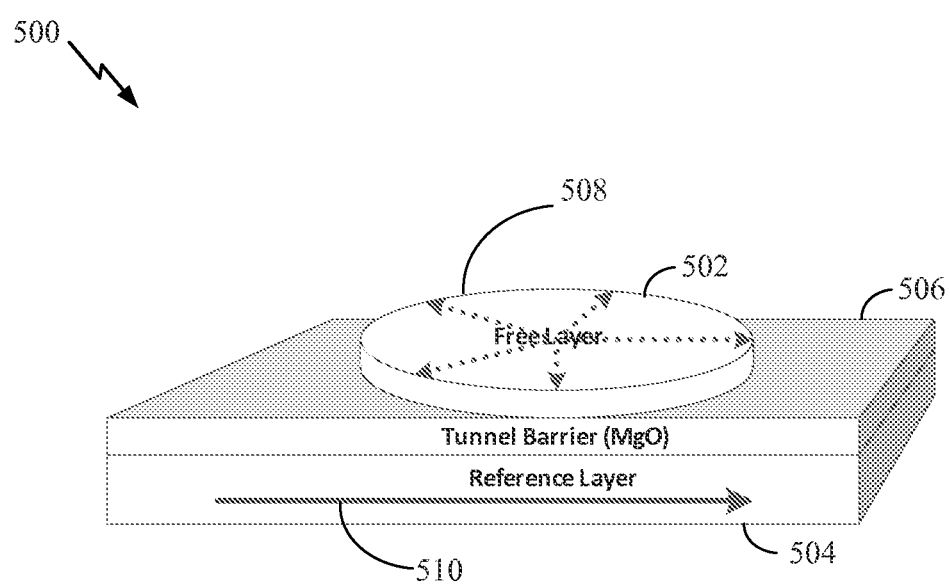
FIG. 5 is a diagram illustrating a clock magnetic tunnel junction according to aspects of the present disclosure.

Aspects of the present disclosure include an MTJ that is configured for sensing an oscillating magnetic field. An MTJ structure that can be used as a clock MTJ in the disclosed apparatus is described with reference to FIG. 5. The clock MTJ 500 includes a free layer 502, a reference layer 504 and a tunnel barrier layer 506 between the free layer 502 and the reference layer 504. According to aspects of the present disclosure, the clock MTJ 500 may be configured to exhibit zero or small anisotropy to facilitate weak field sensing and may be constructed within a small area to facilitate sensing of a rapidly oscillating magnetic field.

The clock MTJ may have an in-plane magnetic orientation 508. The in-plane magnetic orientation 508 may be orthogonal to perpendicularly magnetized perpendicular magnetic anisotropy (PMA) storage MTJs, which are used in MRAM applications. According to one aspect of the present disclosure, the free layer 502 of a clock MTJ 500 may be circular or substantially circular in shape, providing zero or little magnetic anisotropy. In other words, the free layer magnetic orientation 508 does not have a preferred direction in the plane. This allows the magnetic moment of the free layer 502 to rotate freely and easily in response to an applied magnetic field.

The reference layer magnetic orientation 510 is pinned in a constant direction. According to an aspect of the present disclosure, the reference layer 504 may be configured with strong anisotropy, which may be achieved by configuring the reference layer 504 with shape anisotropy, crystalline anisotropy, or synthetic anti-ferromagnetic (SAF) materials, for example. The MTJ may be constructed to achieve coherent tunneling to provide an improved signal to noise ratio (SNR). According to an aspect of the present disclosure, MgO thickness in the tunnel barrier layer 506 may be tuned for sensing currents less than 10 uA when a Vdd bias voltage is applied across the clock MTJ.

According to aspects of the present disclosure the clock MTJ 500 can be excited by an oscillating magnetic field in the plane of the free layer 502. In one aspect of the disclosure, the oscillating magnetic field is a rotating magnetic field, which causes the free layer magnetic orientation 508 to rotate. The rotating magnetic field provides sensing with improved sensitivity because no bias magnetic field is used and provides a full swing clock signal which improves SNR. As the magnetic orientation of the free layer rotates, the MTJ alternates between a parallel state with a low resistance (parallel resistance) Rp and an anti-parallel state with a higher resistance (anti-parallel resistance (Rap). The parallel state occurs when a free layer magnetic orientation 508 is parallel to the reference layer magnetic orientation 510. The an anti-parallel state occurs when the free layer magnetic orientation 508 is anti-parallel to the reference layer magnetic orientation 510. A local clock signal can be generated by sensing the resistance change of the MTJ 500 as it alternates between Rp and Rap in response to the oscillating magnetic field. The sinusoidal resistance change can be converted into a square wave clock signal by techniques such as saturation amplification in the clock generation circuitry, for example.

Clock Generation Circuitry

Figure 6A:
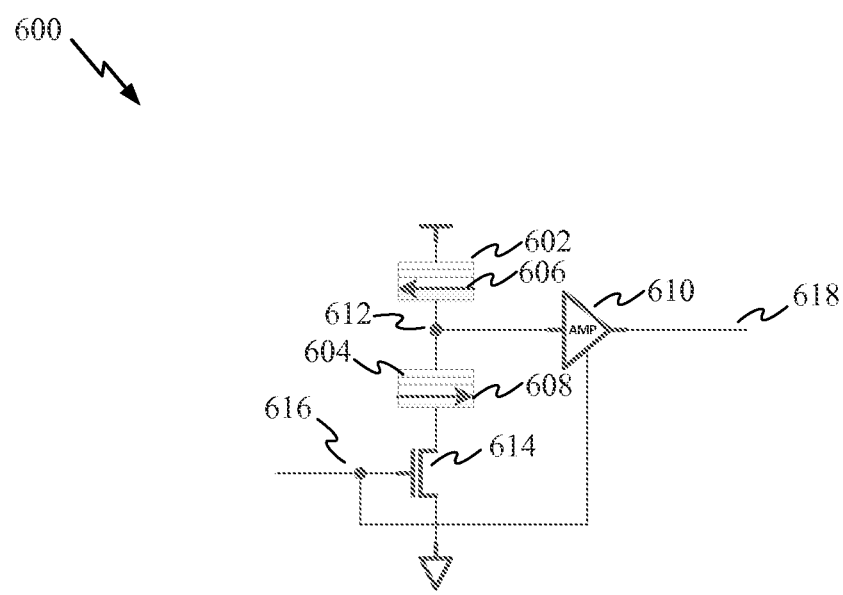
FIGS. 6A and 6B are a schematic circuit diagram illustrating clock generation circuitry according to aspects of the present disclosure.

As shown in FIG. 6A, a clock generation circuit 600 according to one aspect of the disclosure may include local differential sensing using two types of clock MTJs 602, 604. A first clock MTJ 602 is configured with its reference layer magnetic orientation 606 in a first direction and a second clock MTJ 604 is configured with its reference layer magnetic orientation 608 in a second direction opposite to the first direction. These two types of clock MTJs may be constructed to achieve reference layers magnetized opposite to each other by constructing their respective reference layers with different coercivities and/or two different thicknesses, for example. The first MTJ is in a parallel state and exhibits a high resistance Rap at the same time as the second clock MTJ is in an anti-parallel state and exhibits a low resistance Rp in response to the applied oscillating magnetic field, and vice versa. The use of two types of clock MTJs 602, 604 as shown in FIG. 6A, mitigates the effects of process variation and improves signal to noise ratio.

Amplifier circuitry 610 coupled to a node 612 between the two clock MTJs 602, 604 senses the oscillating voltage resulting from oscillating resistance of the clock MTJs 602, 604. The amplifier circuitry is configured to provide a rail to rail clock output in response to the sensed oscillating voltage. A clock enable transistor 614 is coupled in series with the clock MTJs 602, 604. A clock enable node 616 is coupled to the clock enable transistor 614 and the amplifier circuitry 610. A clock enable signal on the clock enable node 616 gates the clock generation circuitry 600 by turning on the amplifier circuitry 610 and turning on a sense current through the clock MTJs 602, 604. The amplifier circuitry 610 output node 618 is coupled to clocked circuitry 304 as shown in FIG. 3, for example. In one aspect of the present disclosure, the amplifier circuitry 610 may be Schmitt triggered.

A clock generation circuit 620 according to another aspect of the present disclosure is described with reference to FIG. 6B. The clock generation circuitry 620 according to this aspect of the disclosure may include local differential sensing using two clock MTJs 622, 624 of the same type. A first clock MTJ 622 is configured with its reference layer magnetic orientation 626 in a first direction and a second clock MTJ 624 is configured with its reference layer magnetic orientation 628 also in the first direction. In this aspect, because reference layers of both MTJs 622, 624 have the same magnetic orientation, the MTJs 622, 624 may be conventional MTJs such as those used in MRAM and may fabricated in an MRAM fabrication process, for example.

Figure 6B:
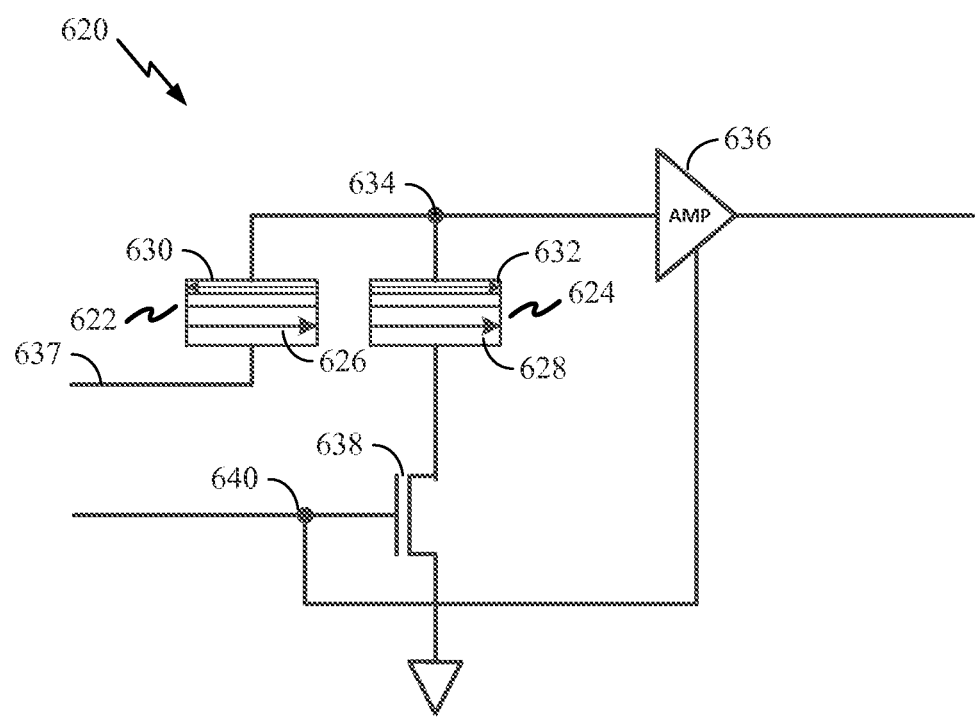

In FIG. 6B, the free layer 630 of the first MTJ 622 is coupled to the free layer 632 of the second MTJ 624 and to an input node 634 of amplifier circuitry 636. Thus, the voltage of the free layers 630, 632 is used to provide a sense current to the MTJs 622, 624 and is also provided to the amplifier circuit 636, for amplification. The amplifier circuitry 636 senses an oscillating voltage resulting from oscillating resistance of the clock MTJs 622, 624. The amplifier circuitry 636 is configured to provide a rail to rail clock output in response to the sensed oscillating voltage.

A reference layer of the first MTJ 622 is coupled to an initialization node 637. A clock enable transistor 638 is coupled in series with the second clock MTJ 624. A clock enable node 640 is coupled to the clock enable transistor 638 and the amplifier circuitry 636. A clock enable signal on the clock enable node 640 gates the clock generation circuitry 620 by turning on the amplifier circuitry 636 and turning on a sense current through the second clock MTJ 624. Output of the amplifier circuitry 636 may be coupled to clocked circuitry 304 as shown in FIG. 3, for example. In one aspect of the present disclosure, the amplifier circuitry 636 may be Schmitt triggered.

According to this aspect of the disclosure, the MTJs 622, 624 are initially configured in two complementary states by applying a voltage at the initialization node 637, which is sufficient to switch the first MTJ 622 to an anti-parallel state, and to switch the second MTJ 624 to a parallel state. After the initial configuration, another smaller voltage may be applied at the initialization node 637. When a magnetic field is applied with its orientation in the plane of MTJ layers and perpendicular to the reference layer magnetic orientations 626, 628, the resistance of the first MTJ 622 in the anti-parallel state decreases, while the resistance of the second MTJ 624 in the parallel state increases. When the magnetic field oscillates to cross zero strength, the two MTJs 622, 624 resume their intrinsic resistance. This causes the voltage level at the free layers of the MTJs 622, 624 to oscillate. These voltage level oscillations are sensed by the amplifier circuitry 636 to generate the clock signal.

Figure 7A:
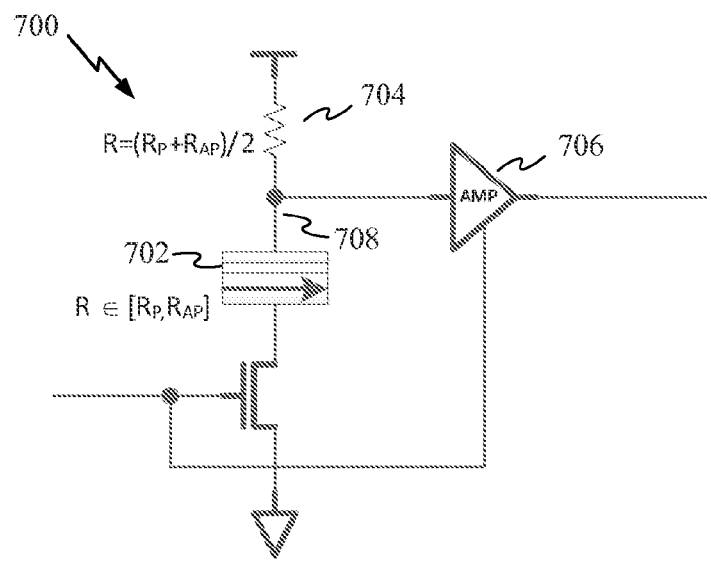
FIGS. 7A and 7B are schematic circuit diagrams illustrating clock generation circuitry according to aspects of the present disclosure.

According to another aspect of the present disclosure, clock generation circuitry may configured with a single clock MTJ. Referring to FIG. 7A, clock generation circuitry 700 includes a clock MTJ 702 coupled to a resistor 704. The resistor may have a resistance value that is selected to be about halfway between the low resistance state Rp and the high resistance state Rap of the clock MTJ 702, for example. The resistor 704 may be implemented on a polysilicon layer to simplify production, for example. Amplifier circuitry 706 senses the voltage at a node 708 between the resistor 704 and the clock MTJ 702 and provides a gated clock output in the same manner as in the clock generation circuitry 600 that was described with reference to FIG. 6A.

Figure 7B:
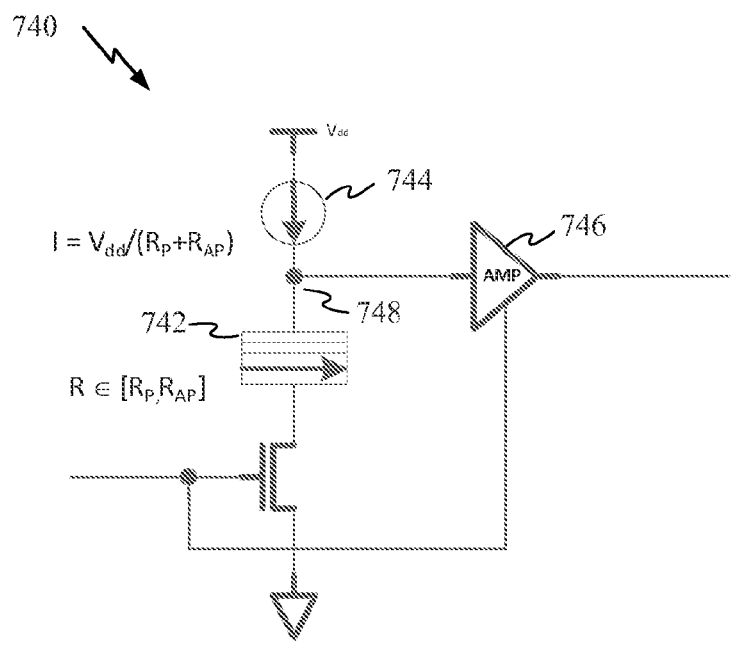

Another example of clock generation circuitry configured with a single clock MTJ is described with reference to FIG. 7B. The clock generation circuitry 740 includes a clock MTJ 742 coupled to a current source 744. The current source may provide a current I=Vdd/(Rp+Rap) that is selected to be about equal to the current through a resistance that is about halfway between the low resistance state Rp and the high resistance state Rap of the clock MTJ 742, for example. The current provided by the current source 744 may be adjustable to mitigate process, voltage and temperature (PVT) variation, for example. Amplifier circuitry 746 senses the voltage at a node 748 between the current source 744 and the clock MTJ 742 and provides a gated clock output in the same manner as in the clock generation circuitry 600 that was described with reference to FIG. 6A.

Figure 8A:
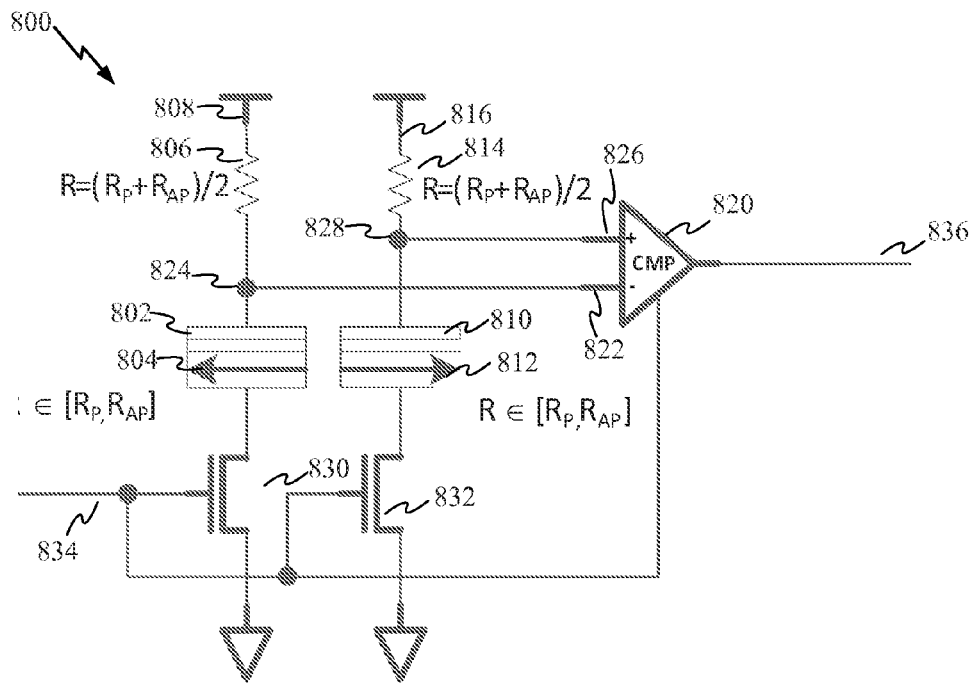
FIGS. 8A and 8B are schematic circuit diagrams illustrating clock generation circuitry according to aspects of the present disclosure.

FIG. 8A shows clock generation circuitry 800 using two different clock MTJs 802, 810 that are configured in separate current paths. A first clock MTJ 802 with its reference layer magnetic orientation 804 in a first direction is coupled in series with a first resistor 806 in a first current path 808. A second clock MTJ 810 with its reference layer magnetic orientation 812 in a second direction opposite to the first direction is coupled in series with a second resistor 814 in a second current path 816.

These two types of clock MTJs may be constructed to achieve reference layers magnetized opposite to each other by constructing their respective reference layers with different coercivities and/or two different thicknesses, for example. The first MTJ is in a parallel state and exhibits a high resistance Rap at the same time as the second clock MTJ is in an anti-parallel state and exhibits a low resistance Rp in response to the applied oscillating magnetic field, and vice versa. The use of two types of clock MTJs 802, 810 as shown in FIG. 8A, mitigates the effects of process variation and improves signal to noise ratio.

The first resistor 806 and second resistor 814 may have the same resistance value that is selected to be about halfway between the low resistance state Rp and the high resistance state Rap of the clock MTJs 802, 810, for example. The first resistor 806 and second resistor 814 may be implemented on a polysilicon layer to simplify production, for example.

Comparator circuitry 820 includes a first comparator input 822 coupled to a first sense node 824 between the first clock MTJ 802 and the first resistor 806, and a second comparator input 826 coupled to a second sense node 828 between the second clock MTJ 810 and the second resistor 814. The comparator circuitry 820 is configured to provide a rail to rail clock output in response to the difference of the sensed oscillating voltages on the first sense node 824 and the second sense node 828. Clock enable transistors 830, 832 are coupled in series with the clock first clock MTJ 802 and the second clock MTJ 810. A clock enable node 834 is coupled to the clock enable transistors 830, 832 and the comparator circuitry 820. A clock enable signal on the clock enable node 834 gates the clock generation circuitry 800 by turning on the comparator circuitry 820 and turning on sense currents through the first clock MTJ 802 and the second clock MTJ 810. The comparator output node 836 is coupled to clocked circuitry 302 as shown in FIG. 3, for example. In one aspect of the present disclosure, the comparator circuitry 820 may be Schmitt triggered.

Figure 8B:
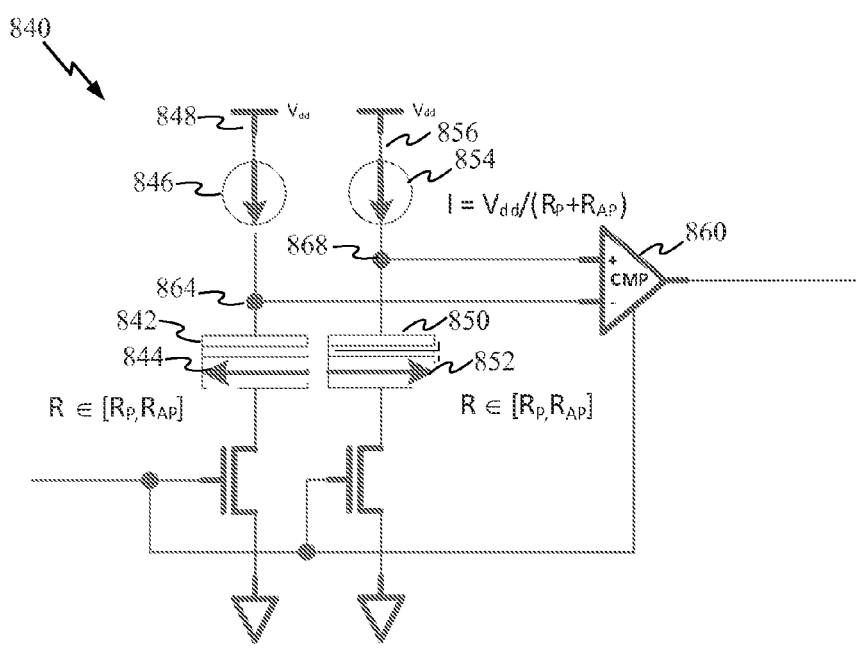

FIG. 8B shows clock generation circuitry 840 using two different clock MTJs 842, 850 that are configured in separate current paths according to another aspect of the present disclosure. A first clock MTJ 842 with its reference layer magnetic orientation 844 in a first direction is coupled in series with a first current source 846 in a first current path 848. A second clock MTJ 850 with its reference layer magnetic orientation 852 in a second direction opposite to the first direction is coupled in series with a second current source 854 in a second current path 856. The first current source 846 and second current source 854 may each provide a current I=Vdd/(Rp+Rap) that is selected to be about equal to the current through a resistance that is about halfway between the low resistance state Rp and the high resistance state Rap of the clock MTJs 842, 850, for example. The current provided by each of the current sources 846, 854 may be adjustable to mitigate process, voltage and temperature (PVT) variation, for example. Comparator circuitry 860 senses the difference between voltages at a first sense node 864 between the first current source 846 and the first clock MTJ 842, and a second sense node 868 between the second current source 854 and the second clock MTJ 850. The comparator circuitry 860 provides a gated clock output to clocked circuitry 302 (FIG. 3) in the same manner as described above in the clock generation circuitry 800 shown in FIG. 8A.

Field Distribution Circuitry

According to aspects of the present disclosure, clock signals are distributed by conveying an oscillating magnetic field across a device. In one aspect, the oscillating magnetic field may be a rotating field to reduce lag and power consumption, for example. Magnetic tunnel junctions (MTJs) in clock generation circuitry distributed around the device are used to sense the oscillating fields and convert the oscillating magnetic fields to a local clock signal by gating local clock distribution circuitry as described above with reference to FIGS. 6A-8B. According to aspects of the present disclosure, the oscillating magnetic fields may be generated from resonant circuits to further reduce power consumption.

Figure 9A:
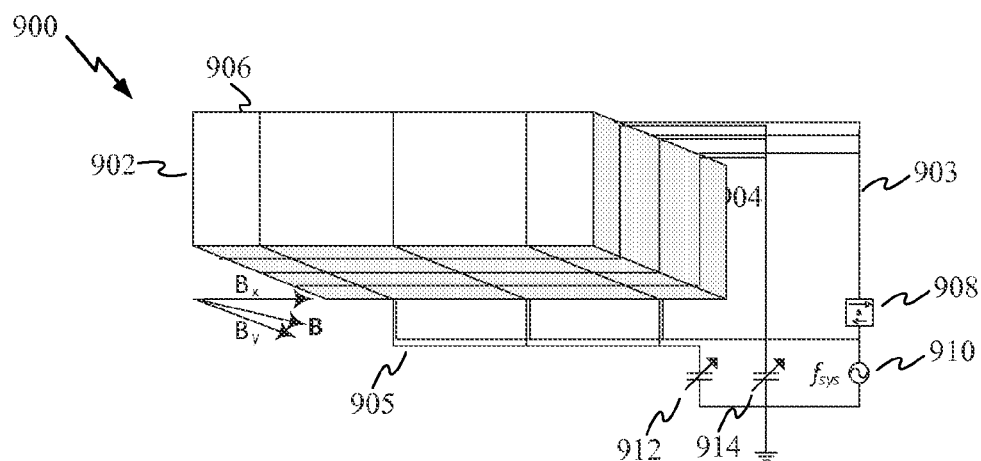
FIG. 9A is a schematic diagram illustrating magnetic field distribution circuitry according to an aspect of the present disclosure.

Referring to FIG. 9A, the oscillating magnetic fields may be conveyed by wrapping conductors 904, 906 around a die or package 902. According to this aspect of the disclosure, magnetic field distribution circuitry 900 includes two sets of conductors 904, 906 coupled to an oscillating current source 910 by current paths 903, 905 to induce two oscillating magnetic fields of equal strength on the die or package 902. One set of the conductors 904, is configured in an X direction on an xy plane of the die, and the other set of conductors 906 is configured in a Y direction on the xy plane of the die or package 902. A phase shifter 908 coupled to the oscillating current source 910 provides a phase difference of 90 degrees or 270 degrees between currents on the conductors 904, 906.

The oscillating current source 910 may include a tank circuit having a resonant frequency tuned to a system clock frequency on the die or package 902. Induction coils of the tank circuitry may be coupled to the conductors 904, 906 with equal length current paths 903, 905 to reduce skew. The current paths may include conductor wiring in a coaxial, twisted pair or H-tree configuration, for example. Broadband capability may be achieved by using variable capacitors 912, 914 or a switched capacitor array coupled to the conductors 904, 906.

Figure 9B:
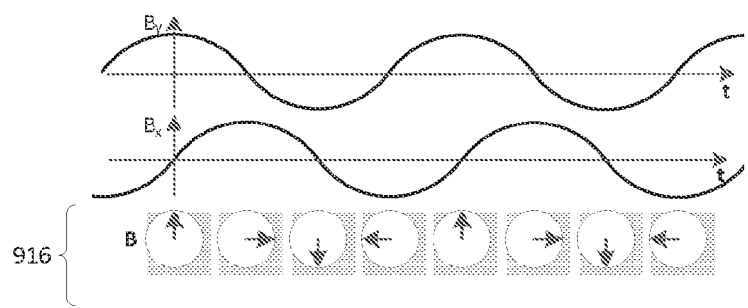
FIG. 9B is a graph illustrating an oscillating magnetic field according to aspects of the present disclosure.

FIG. 9B shows the superposition of magnetic fields $B_x$ and $B_y$ resulting from the oscillating current source 910 in the configuration shown in FIG. 9A. The top view 916 shows the resulting magnetic field B which rotates in the xy plane of the die.

Figure 10A:
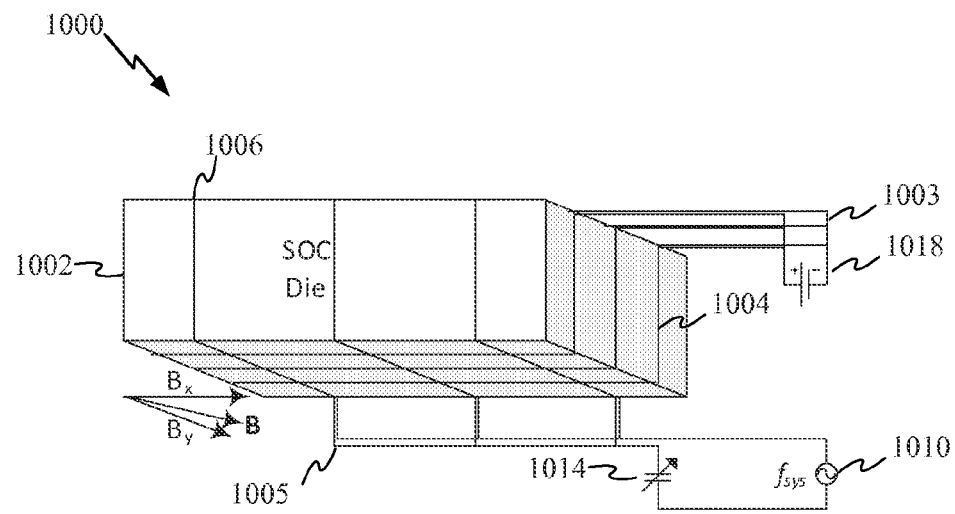
FIG. 10A is a schematic diagram illustrating magnetic field distribution circuitry according to an aspect of the present disclosure.

According to another aspect of the present disclosure, the oscillating magnetic field may be composed of one oscillating magnetic field Bx and a one constant bias magnetic field By. Referring to FIG. 10A, the oscillating magnetic fields may be conveyed by wrapping conductors 1004, 1006 around a die or package 1002. According to this aspect of the disclosure, magnetic field distribution circuitry 1000 includes a first set of the conductors 1006 configured in the y direction of an xy plane on the die or package 1002 and coupled to an oscillating current source 1010 by current paths 1005. A second set of conductors 1004 is configured in the x direction of the xy plane on the die or package 1002 and is coupled to a constant bias source 1018 by current paths 1003. According to another aspect of the disclosure, a constant magnetic field in the x direction may be provided by DC coils or permanent magnets, for example.

The oscillating current source 1010 may include a tank circuit having a resonant frequency tuned to a system clock frequency on the die or package 1002. Induction coils of the tank circuitry may be coupled to the conductors 1006 with equal length current paths 1005 to reduce skew. The current paths 1005 may include conductor wiring in a coaxial, twisted pair or H-tree configuration, for example. Broadband capability may be achieved by using variable capacitors 1014 or switched capacitor array coupled to the conductors 1006.

Figure 10B:
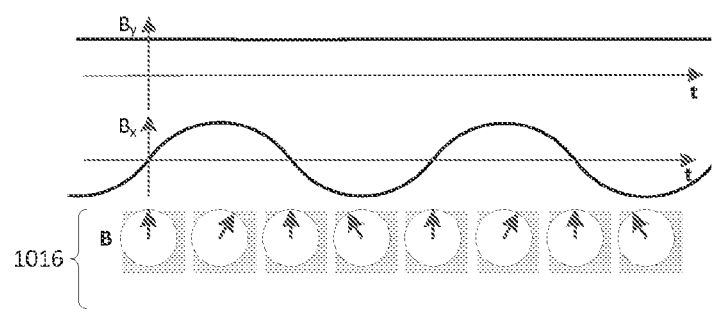
FIG. 10B is a graph illustrating an oscillating magnetic field according to aspects of the present disclosure.

FIG. 10B shows the superposition of the constant magnetic field $B_y$ and the oscillating magnetic fields $B_x$ resulting from the oscillating current source 1010 in the configuration shown in FIG. 10A. The top view 1016 shows the resulting magnetic field B which oscillates in the xy plane of the die.

A configuration for distributing clock signals on a die includes means for applying oscillating magnetic fields to distributed MTJs, means for sensing the oscillating magnetic fields by the MTJs, and means for converting the sensed magnetic field oscillations into a clock signal by circuitry coupled to the MTJs. The means for applying oscillating magnetic fields to distributed MTJs can include the magnetic field distribution circuitry 900 as described with reference to FIG. 9A, for example. The means for sensing the oscillating magnetic fields may include the clock MTJs 500 as described with reference to FIG. 5, for example. The means for converting the sensed magnetic field oscillations into a clock signal may include the clock generation circuitry 600 as described with reference to FIG. 6A, for example.

Figure 11:
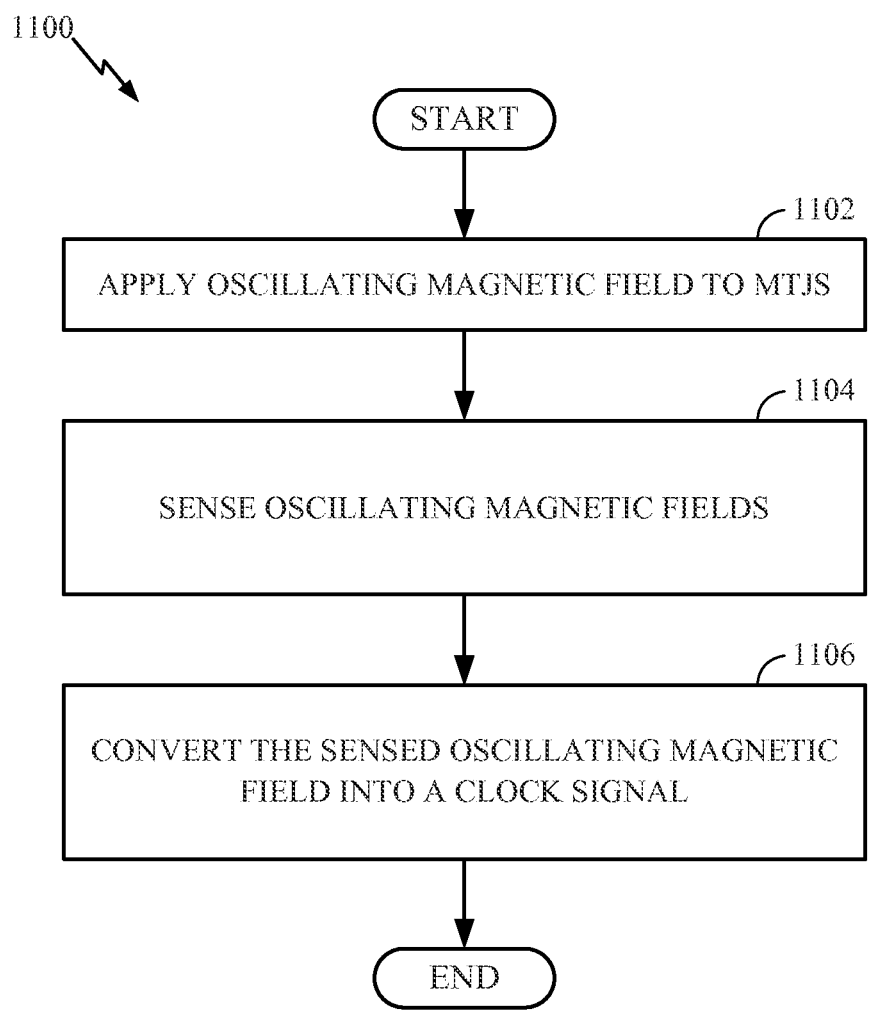
FIG. 11 is process flow diagram illustrating a method of distributing a clock signal according to aspects of the present disclosure.

FIG. 11 is a process flow diagram illustrating a method 1100 of distributing clock signals according to one aspect of the disclosure. The method includes applying oscillating magnetic fields to a number of distributed magnetic tunnel junctions (MTJs) in block 1102 and sensing the oscillating magnetic fields by the MTJs in block 1104. The method also includes converting the sensed magnetic field oscillations into clock signals by circuitry coupled to the MTJs in block 1106.

Figure 12:
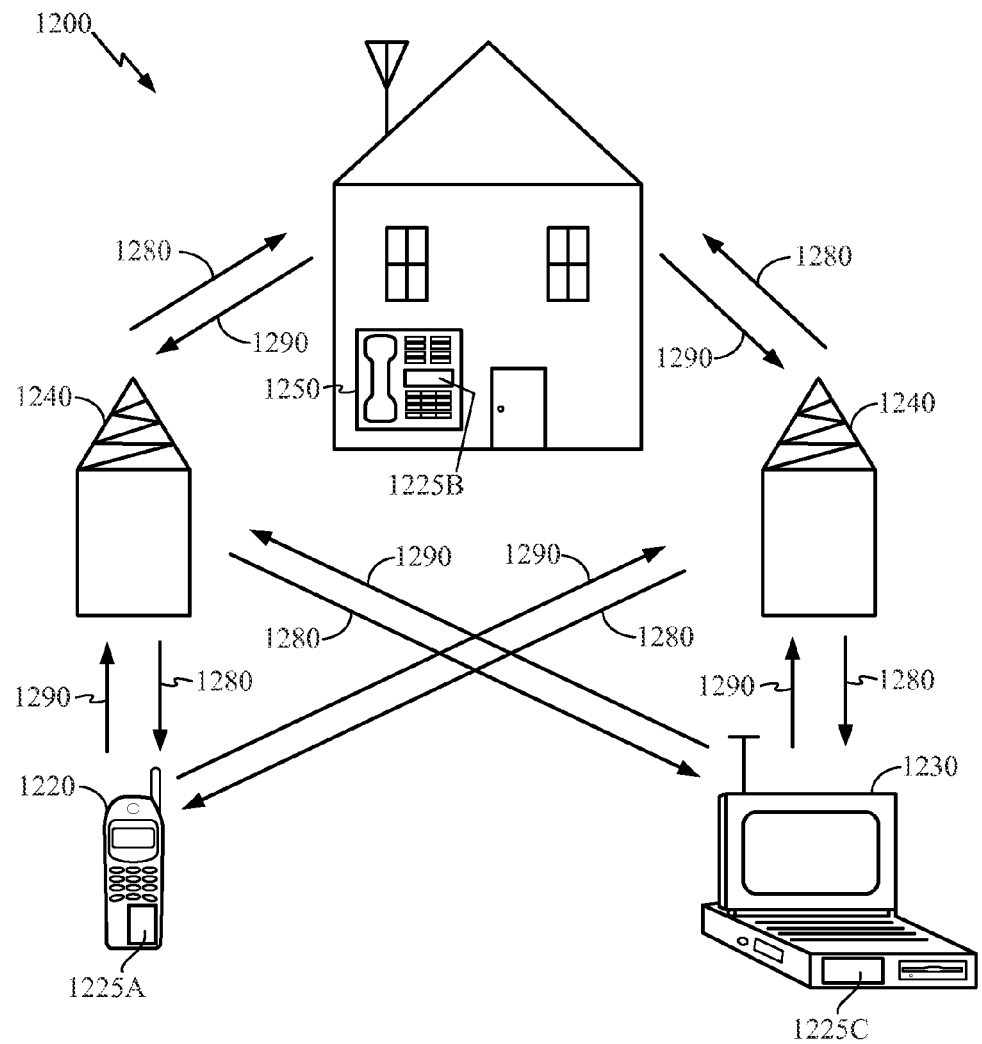
FIG. 12 is a block diagram showing an exemplary wireless communication system in which an aspect of the disclosure may be advantageously employed.

FIG. 12 is a block diagram showing an exemplary wireless communication system 1200 in which an aspect of the disclosure may be advantageously employed. For purposes of illustration, FIG. 12 shows three remote units 1220, 1230, and 1250 and two base stations 1240. It will be recognized that wireless communication systems may have many more remote units and base stations. Remote units 1220, 1230, and 1250 include IC devices 1225A, 1225C and 1225B that include the disclosed clock distribution apparatus. It will be recognized that other devices may also include the disclosed clock distribution apparatus, such as the base stations, switching devices, and network equipment. FIG. 12 shows forward link signals 1280 from the base station 1240 to the remote units 1220, 1230, and 1250 and reverse link signals 1290 from the remote units 1220, 1230, and 1250 to base stations 1240.

In FIG. 12, remote unit 1220 is shown as a mobile telephone, remote unit 1230 is shown as a portable computer, and remote unit 1250 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 12 illustrates remote units according to the teachings of the disclosure, the disclosure is not limited to these exemplary illustrated units. Aspects of the disclosure may be suitably employed in many devices which include clock distribution circuitry.

Figure 13:
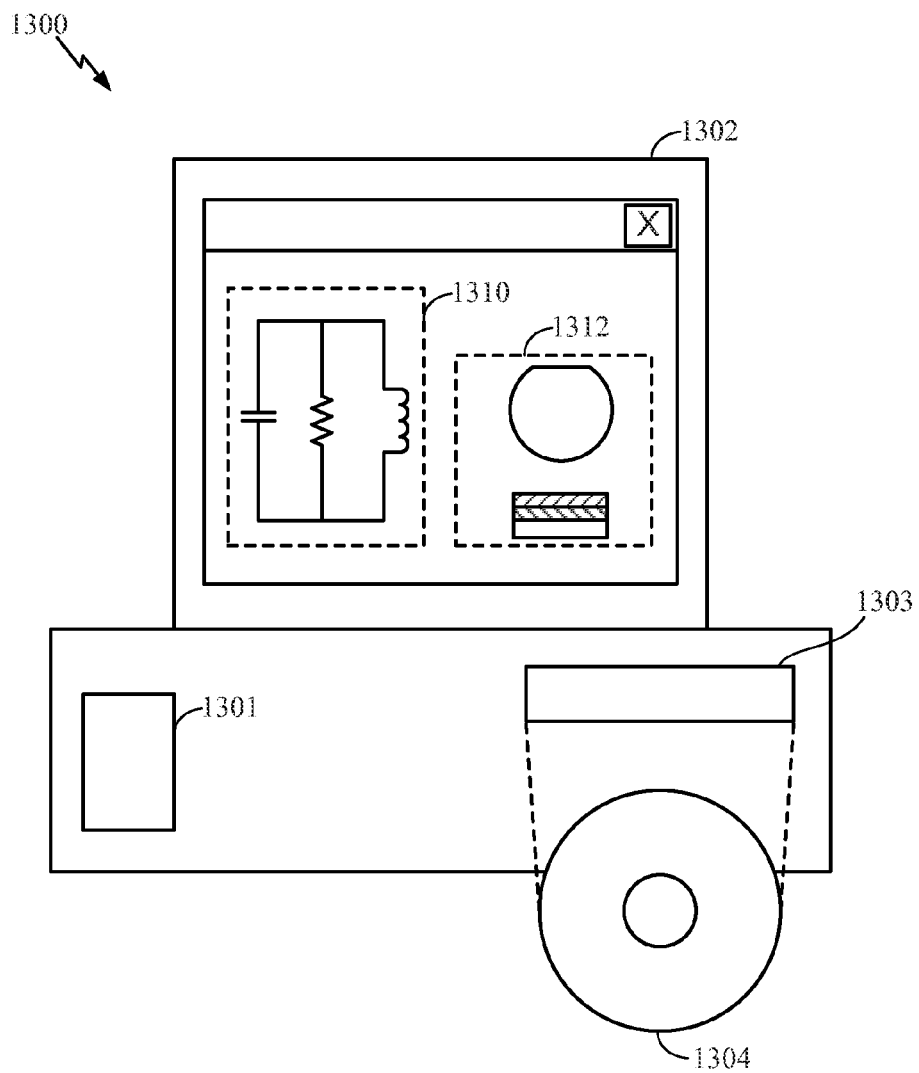
FIG. 13 is a block diagram illustrating a design workstation used for circuit, layout, and logic design of two-stage sense apparatus according to one aspect of the present disclosure.

FIG. 13 is a block diagram illustrating a design workstation used for circuit, layout, and logic design of a semiconductor component, such as the clock distribution apparatus disclosed above. A design workstation 1300 includes a hard disk 1301 containing operating system software, support files, and design software such as Cadence or OrCAD. The design workstation 1300 also includes a display 1302 to facilitate design of a circuit 1310 or a semiconductor component 1312 such as a clock distribution apparatus. A storage medium 1304 is provided for tangibly storing the circuit design 1310 or the semiconductor component 1312. The circuit design 1310 or the semiconductor component 1312 may be stored on the storage medium 1304 in a file format such as GDSII or GERBER. The storage medium 1304 may be a CD-ROM, DVD, hard disk, flash memory, or other appropriate device. Furthermore, the design workstation 1300 includes a drive apparatus 1303 for accepting input from or writing output to the storage medium 1304.

Data recorded on the storage medium 1304 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1304 facilitates the design of the circuit design 1310 or the semiconductor component 1312 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An apparatus for distributing a clock signal, comprising:
   a first clocked circuit on a chip; and
   clock generation circuitry on the chip coupled to the first clocked circuit, the clock generation circuitry including,
      a first magnetic field sensing device configured to sense an oscillating magnetic field, and
      amplifier circuitry coupled between the first magnetic field sensing device and the first clocked circuit, the clock generation circuitry configured to output the clock signal in response to the oscillating magnetic field.

2. The apparatus of claim 1, further comprising:
   field distribution circuitry configured to apply the oscillating magnetic field to the first magnetic field sensing device.

3. The apparatus of claim 1, in which the first magnetic field sensing device comprises a first magnetic tunnel junction (MTJ) including a free layer, a reference layer and a tunnel barrier layer between the free layer and the reference layer, the free layer being configured with an in-plane magnetization direction that oscillates in response to the oscillating magnetic field.

4. The apparatus of claim 3 in which the oscillating magnetic field comprises: a rotating magnetic field aligned with the free layer.

5. The apparatus of claim 4, in which the rotating magnetic field comprises a superposition of a plurality of oscillating magnetic fields aligned with the free layer.

6. The apparatus of claim 1, in which the amplifier circuitry is configured to sense a differential voltage drop across a magnetic tunnel junction (MTJ) and a reference voltage.

7. The apparatus of claim 1, in which the amplifier circuitry is configured to generate the clock signal by comparing differential voltage drops across two magnetic tunnel junctions (MTJs) in response to the oscillating magnetic field, the two MTJs having reference layers with opposite magnetization direction.

8. The apparatus of claim 1, in which the amplifier circuitry is configured to generate the clock signal by comparing differential voltage drops across two magnetic tunnel junctions (MTJs) in response to the oscillating magnetic field, the two MTJs having reference layers with the same magnetization direction.

9. The apparatus of claim 1 integrated in a mobile phone, a set top box, a music player, a video player, an entertainment unit, a navigation device, a computer, a hand-held personal communication systems (PCS) unit, a portable data unit, and/or a fixed location data unit.

10. A method for distributing clock signals, comprising:
    applying an oscillating magnetic field to a plurality of distributed magnetic tunnel junctions (MTJs);
    sensing the oscillating magnetic field by the MTJs; and
    converting the sensed magnetic field oscillations into a clock signal by circuitry coupled to the MTJs.

11. The method of claim 10, further comprising:
    sensing a differential voltage drop across a magnetic tunnel junction (MTJ) and a reference voltage.

12. The method of claim 10, further comprising:
    generating the clock signal by comparing differential voltage drops across two magnetic tunnel junctions (MTJs) in response to the oscillating magnetic field, the two MTJs having reference layers with opposite magnetization direction.

13. The method of claim 10, further comprising:
generating the clock signal by comparing differential voltage drops across two magnetic tunnel junctions (MTJs) in response to the oscillating magnetic field, the two MTJs having reference layers with the same magnetization direction.

14. The method of claim 10, further comprising integrating the plurality of distributed MTJs in a mobile phone, a set top box, a music player, a video player, an entertainment unit, a navigation device, a computer, a hand-held personal communication systems (PCS) unit, a portable data unit, and/or a fixed location data unit.

15. An apparatus for distributing clock signals on a chip, comprising:
means for applying an oscillating magnetic field to a plurality of distributed magnetic tunnel junctions (MTJs);
means for sensing the oscillating magnetic field by the MTJs; and
means for converting the sensed magnetic field oscillations into a clock signal by circuitry coupled to the MTJs.

16. The apparatus of claim 15, further comprising:
means for sensing a differential voltage drop across a magnetic tunnel junction (MTJ) and a reference voltage.

17. The apparatus of claim 15, further comprising:
means for generating the clock signal by comparing differential voltage drops across two magnetic tunnel junctions (MTJs) in response to the oscillating magnetic field, the two MTJs having reference layers with opposite magnetization direction.

18. The apparatus of claim 15, further comprising:
means generating the clock signal by comparing differential voltage drops across two magnetic tunnel junctions (MTJs) in response to the oscillating magnetic field, the two MTJs having reference layers with the same magnetization direction.

19. The apparatus of claim 15, integrated in a mobile phone, a set top box, a music player, a video player, an entertainment unit, a navigation device, a computer, a hand-held personal communication systems (PCS) unit, a portable data unit, and/or a fixed location data unit.

20. A method for distributing clock signals, comprising steps of:
applying oscillating magnetic fields to a plurality of distributed magnetic tunnel junctions (MTJs);
sensing the oscillating magnetic fields by the MTJs; and
converting the sensed magnetic field oscillations into clock signals by circuitry coupled to the MTJs.

21. The method of claim 20, further comprising steps of integrating the plurality of distributed MTJs in a mobile phone, a set top box, a music player, a video player, an entertainment unit, a navigation device, a computer, a hand-held personal communication systems (PCS) unit, a portable data unit, and/or a fixed location data unit.

22. A computer program product for distributing clock signals, comprising:
a non-transitory computer-readable medium having program code recorded thereon, the program code comprising:
program code to apply oscillating magnetic fields to a plurality of distributed magnetic tunnel junctions (MTJs);
program code to sense the oscillating magnetic fields by the MTJs; and
program code to convert the sensed magnetic field oscillations into clock signals by circuitry coupled to the MTJs.

23. The computer program product of claim 22, integrated into a mobile phone, a set top box, a music player, a video player, an entertainment unit, a navigation device, a computer, a hand-held personal communication systems (PCS) unit, a portable data unit, and/or a fixed location data unit.

* * * * *